United States Patent [19]
Keefe et al.

[11] 4,007,445
[45] Feb. 8, 1977

[54] MINIMUM STRUCTURE BUBBLE DOMAIN PROPAGATION

[75] Inventors: George E. Keefe, Montrose; Yeong S. Lin, Mount Kisco, both of N.Y.

[73] Assignee: International Business Machines Corporation, Armonk, N.Y.

[22] Filed: Dec. 31, 1974

[21] Appl. No.: 537,800

[52] U.S. Cl. .................... 340/174 TF; 340/174 EB
[51] Int. Cl.[2] ....................................... G11C 11/14
[58] Field of Search ............... 340/174 TF, 174 SR

[56] References Cited
UNITED STATES PATENTS

| | | | |
|---|---|---|---|
| 3,540,019 | 11/1970 | Bobeck et al. | 340/174 TF |
| 3,602,911 | 8/1971 | Kurtzig | 340/174 TF |
| 3,810,133 | 5/1974 | Bobeck et al. | 340/174 TF |
| 3,811,120 | 5/1974 | Bobeck | 340/174 TF |
| 3,876,994 | 4/1975 | Calhoun | 340/174 TF |

OTHER PUBLICATIONS

IBM Technical Disclosure Bulletin, vol. 17, No. 9, Feb. 1975, pp. 2827–2828.

Primary Examiner—James W. Moffitt
Attorney, Agent, or Firm—Jackson E. Stanland

[57] ABSTRACT

It has been discovered that magnetic bubble domains can be moved in a magnetic medium without requiring shaped structure along which magnetic poles are created for movement of the domains, and without reliance on magnetic fields established by conductor patterns. If a magnetic field is applied in the plane of the magnetic medium, bubble domains will be stretched in a direction parallel or anti-parallel to the field direction depending on the bubble domain polarity. If this magnetic field has an asymmetry in its amplitude versus time waveform, or if an asymmetry is created by a propagation element, bubble domains can be moved in the magnetic material. This discovery can be used to move bubble domains in a magnetic medium without requiring structure having a particular shape for domain movement, and without requiring conductors. Also, improvements can be made to existing propagation structures to make them more useful.

23 Claims, 12 Drawing Figures

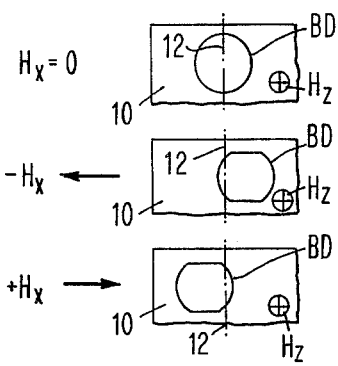
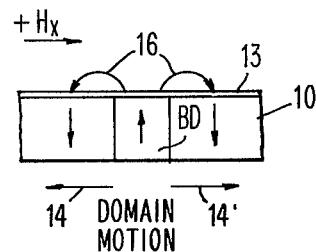
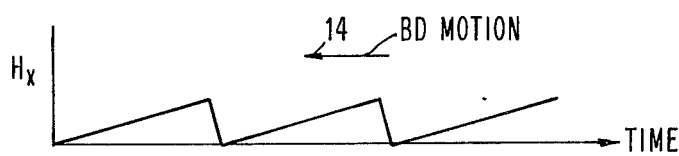
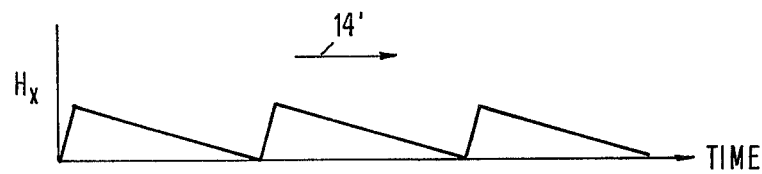
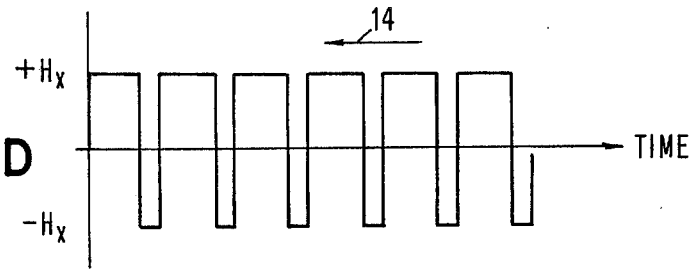
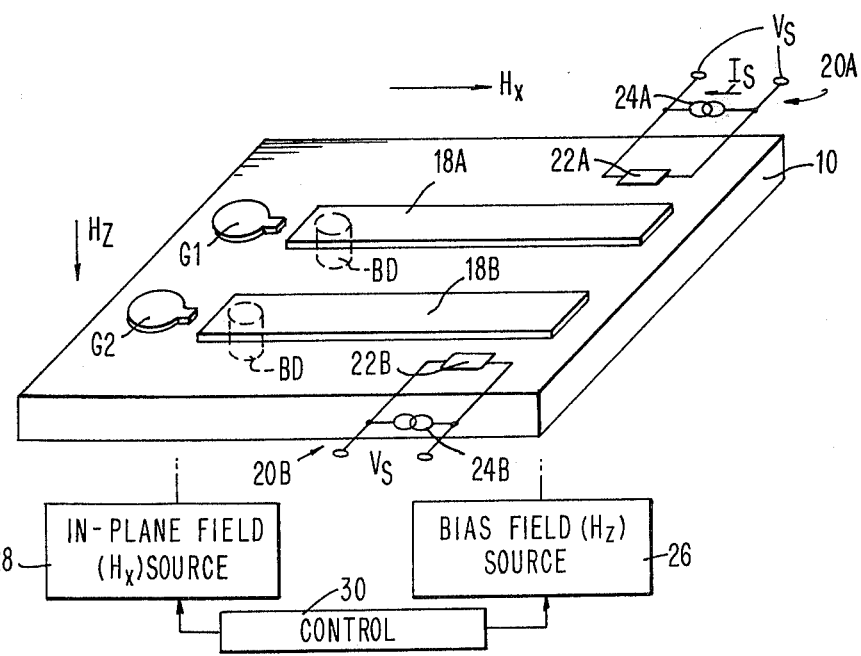

MINIMUM STRUCTURE BUBBLE DOMAIN PROPAGATION

BACKGROUND OF THE INVENTION

1. Field of the Invention

This invention relates to propagation techniques for moving magnetic bubble domains in a magnetic medium, and to improved techniques which do not require shaped propagation structure such as magnetic elements along which poles are created for domain movement or conductor patterns, or which may be used to enhance or change the operation of conventional propagation structures.

2. Description of the Prior Art

Magnetic bubble domains have been moved in various magnetic media using a wide variety of techniques. For instance, bubble domains have been moved by using repetitive patterns of current conductors and by repetitive patterns of magnetic elements, such as the familiar T-I bars, chevrons, zig-zag bars, and disk shaped structures. The magnetic elements comprising conventional propagation structures can be comprised of magnetic material, such as permalloy, or can be comprised of ion implanted regions in the magnetic medium in which the domains exist. Generally, these magnetic propagation structures rely on the interaction between the propagation elements and a magnetic field in the plane of the magnetic medium, in order to establish a sequence of attractive magnetic poles for movement of the bubble domains. On the other hand, the current carrying conductors provide gradients in magnetic field normal to the plane of the magnetic medium in which the bubble domains exist, for movement of the domains in the medium.

The present invention differs from the propagation techniques used in the prior art, in that bubble domains can be moved in a desired direction in a magnetic medium without requiring shaped propagation structure such as discrete magnetic elements, and without requiring conductor circuits. It has been discovered that magnetic bubble domains in a magnetic medium distort in the presence of an in-plane magnetic field, and elongate in a direction along or opposite to the direction of application of the magnetic field depending on the polarity of the domains. In order to move the bubble domains in a preferred direction, an asymmetry is created in the in-plane magnetic field. For instance, the amplitude versus time or the shape versus time of the applied in-plane magnetic field can be varied in order to provide the asymmetry needed for motion in a particular direction. Further, the asymmetry can be provided by magnetic elements as will be described later. Thus, improvements can be made in existing propagation structures and new propagation structures can be provided for movement of magnetic bubble domains with a minimum of complexity of the propagation pattern.

Accordingly, it is an object of the present invention to provide essentially structureless shift registers for movement of magnetic bubble domains.

It is another object of the present invention to provide magnetic propagation structures for moving magnetic bubble domains, which do not rely upon on the creation of magnetic poles along the magnetic structure in order to move the domains.

It is a further object of the present invention to modify conventional propagation structures to provide improved operation with those structures.

It is another object of the present invention to move magnetic bubble domains in a magnetic medium in a way which minimizes the structure required for such movement.

BRIEF SUMMARY OF THE INVENTION

It has been discovered that a magnetic bubble domain will distort in the presence of an in-plane magnetic field. This distortion will cause a stretching of the bubble domain along a direction in or opposite to the direction of application of the in-plane magnetic field, depending on the bubble polarity. This effect is utilized to provide domain propagation without using shaped magnetic or conductor propagation elements for domain movement. In other embodiments, propagation is provided using very simple magnetic structures, where the propagation does not depend on the presence of magnetic poles along the structure for movement of the domains. Still other embodiments show modified conventional propagation structures which take advantage of this discovery to provide improved operation.

Bubble domains are propagated in the magnetic medium without the use of magnetic or conductor circuits in a first embodiment where a magnetic field is applied in the plane of the bubble domain medium. This magnetic field has a varying amplitude with time such that an asymmetry is created in the bubble domain distortion, therefore causing the bubble domain to move in a preferred direction. In order to enhance this effect, a strip of a magnetic material, or an ion implanted region in the bubble domain medium, is used. Bubble domain movement is not by attraction (or repulsion) due to magnetic poles created along the magnetic element, but rather is due to magnetostatic coupling between the magnetic element and the bubble domain. The in-plane magnetic field tends to saturate the magnetic element everywhere except in the region where the field is anti-parallel to the stray field of the bubble domain. In this region, the domain is stretched. The direction of stretch is parallel or anti-parallel to the direction of the in-plane field depending on the bubble polarity (up or down). Since the in-plane field has an irregular waveform, domains will be alternately stretched in different directions (or stretched in one instance and relaxed in the next instance) with a net movement (stretching) in the direction of preferred motion.

In further embodiments, existing propagation structures, such as angelfish structures, are modified so that in-plane magnetic fields can be used for domain movement, rather than having to rely on modulation of a magnetic bias field perpendicular to the plane of the bubble medium.

These and other objects, features, and advantages will be more apparent from the following more particular description of the preferred embodiments.

BRIEF DESCRIPTION OF THE DRAWINGS

FIGS. 1A–1C are schematic drawings illustrating the distortion of a magnetic bubble domain in response to the application of an in-plane magnetic field, as shown in FIG. 2A.

FIG. 2A is a side view of a magnetic bubble domain indicating the stray fields of the domain and the external in-plane magnetic field $H_x$ which produces domain motion in the manner indicated, when the in-plane magnetic field $H_x$ has waveforms such as those illustrated in FIGS. 2B, 2C, and 2D.

FIG. 3 illustrates a bubble domain propagation device using magnetic strips for enhancement of the distortion effect in order to move bubble domains in the magnetic medium, when the in-plane field has a waveform such as that shown in FIGS. 2B–2D.

DETAILED DESCRIPTION OF THE PREFERRED EMBODIMENTS

Figure 4:
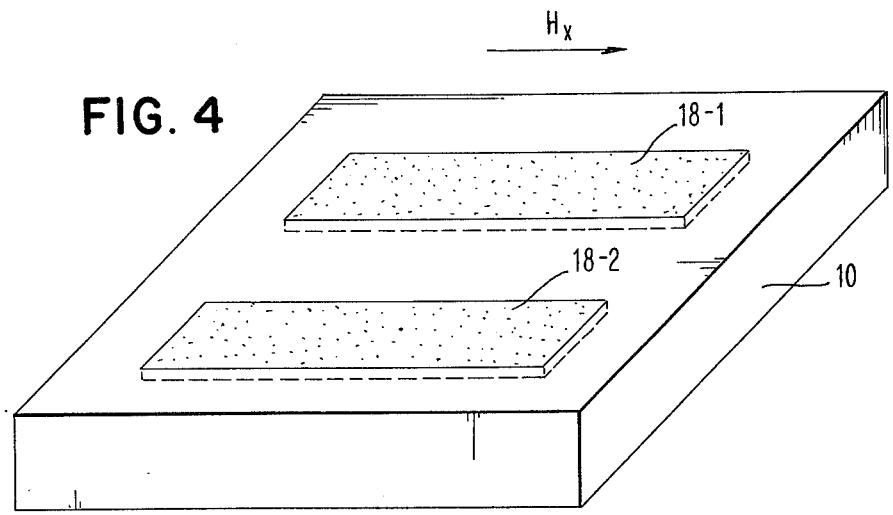
FIG. 4 is an illustration of another propagation structure for movement of magnetic bubble domains, where the magnetic elements are ion implanted structures. The greater detail of FIG. 3 is omitted herein for reasons of simplicity.

General Description Phenomenon (FIGS. 1A–1C, FIGS. 2A–2D)

FIGS. 1A–1C illustrate the behavior of the magnetic bubble domain BD of FIG. 2A when no in-plane magnetic field $H_x$ is present, and when such an in-plane magnetic field is present. For instance, FIG. 1A is a top view of the bubble domain BD in a magnetic medium 10, which can be any magnetic medium having sufficient uniaxial anisotropy to support magnetic bubble domains therein. Such materials are well known in the art and include, for example, materials having garnet structure as well as amorphous magnetic materials. As can be seen from FIG. 1A, a bubble domain BD has a circular shape (in the presence of a perpendicular stabilizing field $H_z$) when on in-plane magnetic field $H_x$ is present. The dashed line 12 through the center of the bubble domain is a reference line which is used to indicate the distortion of the bubble domain when a field $H_x$ is present.

In FIG. 1B, field $H_x$ is present and is directed to the left. This is designated as $(-H_x)$ while a magnetic field directed to the right will be designated $(+H_x)$. As can be seen from FIG. 1B, domain BD having the indicated polarity (up) is distorted and stretched in a direction opposite to the direction of the field $-H_x$.

In FIG. 1C, the field direction is to the right and the domain is stretched toward the left. Thus, the domain is again stretched in a direction opposite to the direction of the in-plane field, in the absence of any magnetic structure.

If domain BD had the opposite polarity (down), its behavior in the presence of the fields $+H_x$ and $-H_x$ would be opposite to that of the up domain in FIG. 2A. That is, it would stretch in the same direction as the fields $+H_x, -H_x$.

FIG. 2A is a side view of domain BD where the field $+H_x$ is directed to the right and layer 13 is a magnetic layer. Domain motion can be produced if an asymmetry in the magnetic field $H_x$ is present. This asymmetry can be produced by varying the amplitude of the field $H_x$ with time. Depending on the rise and fall times of the field $H_x$, unidirectional bubble domain motion along a desired direction can be achieved. Thus, the up domain can be made to move to the left in the direction of arrow 14, or to the right in the direction of arrow 14'.

FIGS. 2B–2D show three suitable waveforms for the field $H_x$, as a function of time. These can be used to move the up bubble domain BD in the direction of arrows 14 and 14', as indicated. Thus, in FIG. 2B, the waveform of $H_x$ is a sawtooth waveform where the rise times of $H_x$ are much slower than the fall times. This causes magnetic bubble domain motion to the left in accordance with arrow 14.

The sawtooth waveform $-H_x$ shown in FIG. 2C has long rise times and short fall times and will produce the opposite effect to the waveform of $+H_x$ shown in FIG. 2B. Accordingly, the up bubble domains will move to the right in the direction of arrow 14' when the waveform shown in FIG. 2C is used for the external applied field $+H_x$.

In FIG. 2D, the field $H_x$ is positive for a greater amount of time than it is negative $(-H_x)$. Thus, up bubble domains will be moved to the left in the direction of arrow 14 when field $H_x$ has this waveform.

For a down bubble domain, movement will be opposite to that for the up bubble domain. Thus, the down domain will move to the right for the waveform of FIG. 2B, to the left when the waveform of FIG. 2C is applied, and to the right when the waveform of FIG. 2D is applied.

From FIGS. 2B–2D, it is apparent that the asymmetry produced by the waveform of $H_x$ is used to provide different coupling of this field to the stray field 16 of the bubble domain BD. Since the domain (up or down) is stretched on the side where its stray field is opposite to the direction of field $H_x$, net displacement will be obtained when the waveforms shown in FIGS. 2B–2D are used. For instance, when the waveform of FIG. 2B is used, the up bubble domains will stretch to the left (stray field 16 opposite to $H_x$ on the left hand side on domain BD) for a fairly long period of time, after which the field pulse $H_x$ will quickly go to zero. Thus, the up domain will be stretched quite far to the left and will not be able to fully relax to its original position when field $H_x$ quickly returns to zero. This produces a net displacement to the left in the direction of arrow 14. Of course, when this is repeated by the next repetitive pulse $H_x$, another unit of net displacement to the left will occur. This can be done any number of cycles to provide continued bubble domain motion in the manner indicated.

The magnitude of $H_x$ is at least equal to the magnitude of the stray field 16 of the domain, in order to have domain stretching. Consequently, the magnitude of $H_x$ is at least about 10–20% $(4\pi M_s)$, where $M_s$ is the saturation magnetization of the bubble material 10. The frequency, pulse width, etc. of $H_x$ is not critical and can be adjusted for different data rates, the same as is done for the conventional rotating field used with T-I bars, etc.

Propagation Structures (FIGS. 3, 4 and 5A–5C)

These figures show various propagation structures which can be made utilizing the aforementioned discovery. In these propagation structures, a magnetic element, such as a magnetically soft material, or an ion implanted region, is used to enhance the aforementioned effect. The magnetic element will hold most of the flux in the applied in-plane field $H_x$ and will enhance the effect on the bubble domain. For instance, a thin permalloy layer provided as a strip along the direction of desired propagation will work well. As the magnetic field $H_x$ is applied having a waveform illustratively as that shown in FIGS. 2B–2D, the magnetostatic coupling strength along the domain perimeter as a result of the in-plane field $H_x$ will be varied. Field $H_x$ will tend to saturate the magnetic element everywhere except in the region where the bubble domain field 16 is anti-parallel to field $H_x$. This causes the stretching action described previously.

FIG. 3 shows a propagation structure comprising two propagation channels. The first channel has a generator G1 for producing up bubble domains in magnetic medium 10 as is well known. These domains will move to the right in response to the application of field $-H_x$ having a waveform such as that shown in FIG. 2C.

In FIG. 3, a magnetic element 18A is used to enhance the magnetostatic coupling effect in order to move the up domains in medium 10. These domains will move to the right toward the sensor 20A as indicated previously. Magnetic element 18A can be, for instance, a magnetically soft material such as NiFe. The thickness of strip 18A can be varied but, in general, thicker strips and smaller magnetic strip-bubble domain spacings enhance the magnetostatic coupling between the strip 18A and the bubble domain. A suitable thickness for strip 18A is 200 Angstroms when permalloy (a trademark of Alleghany Ludlum Corp.) is used for the magnetic material in the strip. The strip can be deposited directly on the bubble domain material 10 or can be separated therefrom by a non-magnetic layer, such as $SiO_2$.

When field $H_x$ is applied, a magnetostatic coupling occurs between strip 18A and the bubble domains BD. Field $H_x$ tends to saturate strip 18A everywhere except in the region where the stray bubble field 16 (FIG. 2A) is anti-parallel to the field $H_x$. Consequently, domains elongate in that region. Because of the asymmetry in the applied field $H_x$, net displacement will occur along the length of strip 18A.

The sensor 20A is a conventional magnetoresistive sensor as is well known in the art. It is comprised of a magnetoresistive sensing element 22A which is connected to a current source 24A. When bubble domains pass sensor element 22A, a change in resistance of this element will occur which can be manifested as an output signal $V_s$. Signal $V_s$ can then be used by any type of utilization device, such as a computer.

The second propagation channel shown in FIG. 3 comprises generator G2, magnetic strip 18B, and sensor 20B, having corresponding components to those in sensor 20A. Operation of this second propagation channel is the same as that for the first propagation channel and need not be further described.

The magnetic bias field $H_z$ is used to stabilize the diameter of domains in magnetic medium 10, in a manner well known. The bias field source 26 provides such a magnetic field using well known components.

The in-plane magnetic field $H_x$ which is used for propagation of domains, is provided by the source 28. Such a source can be a combination of magnetic coils located around the periphery of the magnetic chip 10, which can be separately energized to provide magnetic fields in the proper direction. For instance, magnetic coils on the right-hand side and left-hand side of the chip in FIG. 3 can be pulsed to provide field $H_x$ in the direction indicated. The rise and fall times of the field $H_x$ are determined by the rise and fall times of currents in the coils, as is well known.

A control unit 30 is used to provide proper signals to the field sources 26 and 28, as well as to the generators G and to the sensor current sources 24. This type of operation is well known in the art and will not be described further here.

FIG. 4 illustrates a variation of the structure of FIG. 3, with several components omitted from the drawing to facilitate discussion thereof. In this embodiment, the magnetic strips 18A and 18B are ion implanted regions in magnetic material 10. These regions have a depth of 200 A, for instance, and are characterized by an in-plane magnetization. Their function is identical to that of the magnetic elements 18A and 18B in FIG. 3. That is, they hold most of the magnetic flux from the field $H_x$ and are magnetostatically coupled to the domains in magnetic medium 10. Thus, when field $H_x$ has as asymmetry such as shown in the waveforms depicted in FIGS. 2B–2D, propagation of domains in a preferred direction will occur.

Figure 5A:
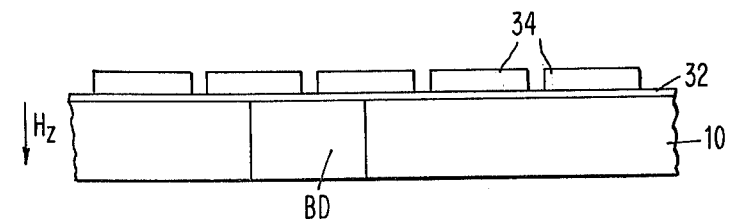
FIGS. 5A and 5B are side and top views, respectively, of a modified angelfish propagation structure which moves bubble domains in response to a rotating magnetic field H (FIG. 5C) in the plane of the magnetic medium, in contrast with conventional angelfish structures where modulation of a bias field normal to the magnetic medium is necessary for domain propagation.
Figure 5B:
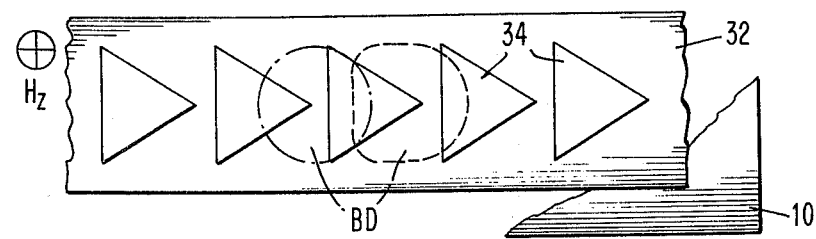
Figure 5C:
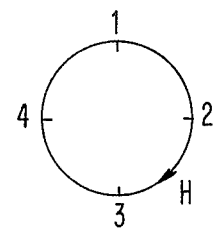

FIGS. 5A and 5B are side and top views of a modified angelfish pattern for movement of magnetic bubble domains. FIG. 5C indicates a rotating in-plane magnetic field H which is used to move bubble domains with the modified angelfish structure shown in FIGS. 5A and 5B.

As is well known, a conventional angelfish pattern is comprised of wedge-shaped magnetic elements located adjacent to the magnetic medium in which the domains move. When the bias field normal to the magnetic medium is modulated in amplitude, the bubble domains expand. An asymmetry is created by the wedge-shaped propagation elements, which converts the bubble domain size modulation to unidirectional motion in accordance with the geometry of the propagation elements.

The major disadvantage of the conventional angelfish propagation structures is that the operating margin of such structures is relatively narrow, because of the necessity for modulating the bias field $H_z$ uniformly in order to provide good bubble domain propagation. In the modified structure of FIGS. 5A and 5B, the need for a modulated perpendicular bias field $H_z$ is obviated and a rotating, in-plane magnetic field H can be used for bubble propagation.

In more detail, the magnetic medium 10 has a magnetic strip 32 located thereon. Strip 32 is a magnetic element such as strips 18A and 18B shown in either FIGS. 3 or 4. Thus, this strip can be a magnetic material such as permalloy or an ion implanted strip in the bubble domain material 10. Located over strip 32 are the conventional wedge-shaped elements 34 normally used in an angelfish pattern. The bubble domain BD is shown under these wedges 34.

In FIG. 5B, the phantom line indicates the position of a bubble domain at one time while the dashed line indicates the position and shape of the bubble domain BD at a later time when it has been expanded and has moved to the right in this drawing.

Movement of the bubble domain in the structure of FIGS. 5A and 5B occurs when the field H reorientates in the manner shown in FIG. 5C. It is not necessary for bubble domain movement that a bias field $H_z$ normal to magnetic medium 10 be modulated in magnitude. Instead, field $H_z$ can be of constant magnitude. In the case of a rotating field H, the necessary asymmetry for unidirectional motion of the bubble domains is provided by the triangular shaped wedges. This is the same function that these wedges have for conventional angelfish propagation structures. However, the presence of the magnetic strip 32 means that the propagation mechanism is the elongation and distortion of the bubble domain which is part of the present invention. Thus, the structure of FIGS. 5A and 5B has two advantages over conventional angelfish circuits. A first advantage is that an in-plane magnetic field can be used rather than modulation of a perpendicular magnetic field. Thus, there is not stringent requirement on the magnetic bias field $H_z$ and the operating margin of the propagation structure is wider. A second advantage is obtained since only a thin magnetic strip 32 is required, rather than two magnetic guide rails for channels as is known in the conventional angelfish propagation structures. This means that the storage density in a system employing the present propagation structure is no longer limited by the width of the magnetic guide rails as was previously the situation.

What has been described is an improved technique for propagation of magnetic bubble domains in a magnetic medium. In all aspects, the complexity of the structure used for propagation is minimized and no external shaped magnetic or conductor elements are required for domain propagation. In contrast with prior art propagation structures, magnetic elements can be utilized along which magnetic poles do not have to be established for movement of magnetic domains. Additionally, conductors do not have to be present for production of magnetic field gradients used to move magnetic bubble domains.

The advantages described above mean that the proposed propagation techniques can be used for any type of bubble domain application. Thus, regardless of the type of storage or type of device to be provided, movement of bubble domains in a portion of the magnetic medium, or throughout the magnetic medium, can occur using the aforementioned principles.

What is claimed is:

1. A method for propagating magnetic bubble domains in a magnetic medium along the length of an elongated magnetic strip, adjacent to said medium including the step of applying a unidirectional external magnetic field in the plane of said medium and along the length of said magnetic strip, said external field having an amplitude which varies with time, where the rise time of said field is different from the fall time of said field said amplitude being at least as large as the amplitude of the stray magnetic field of said domains.

2. A method for propagating magnetic bubble domains in a magnetic medium along the length of an elongated magnetic strip adjacent to said medium including the step of applying a magnetic field in the plane of said medium, said magnetic field having a first orientation parallel to said strip during a first time and a second orientation opposite to said first orientation during a second time, where the amplitude of said magnetic field in said first orientation is greater than its amplitude in said second orientation.

3. A method for propagating magnetic bubble domains in a magnetic medium along the length of an elongated unidirectional magnetic strip adjacent to said magnetic medium, including the step of applying a magnetic field in the plane of said medium, said magnetic field having a first orientation along the direction of said strip during a first time and a second orientation antiparallel to said first direction during a second time, where the duration of said magnetic field in said first orientation is different than its duration in said second orientation.

4. A method for propagating magnetic bubble domains in a magnetic medium along the length of an elongated magnetic strip adjacent to said magnetic medium, including the step of applying repetitive cycles of a magnetic field in the plane of said medium and directed parallel to said magnetic strip, each said cycle of said external magnetic field being characterized by an amplitude versus time waveform having at least two unequal parts with respect to time or amplitude.

5. A structure for moving magnetic bubble domains in a magnetic bubble domain medium, comprising:
 a magnetic element extending along a first direction and having a magnetization in the plane of said magnetic element,
 means for producing repetitive cycles of a magnetic field in the plane of said magnetic element and along the direction of said magnetic element to move said domains along said magnetic element, where said magnetic field does not produce magnetic poles along said element for movement of said domains, said magnetic field having an asymmetric waveform with time for each said cycle.

6. The structure of claim 5, where said magnetic element is a strip of magnetically soft material having a geometry such that magnetic poles are not produced along said strip during application of said magnetic field, in a direction along said strip.

7. The structure of claim 5, where said magnetic element is an ion implanted region in said bubble domain magnetic medium, said ion implanted region having a geometry such that magnetic poles for movement of said bubble domains are not created along said strip during the application of said external magnetic field.

8. The structure of claim 5, where each cycle of said magnetic field produces a unidirectional field pulse whose rise time is not equal to its fall time.

9. The structure of claim 5, where each cycle of said magnetic field includes a magnetic field pulse having a first orientation and an opposite second orientation both of which are parallel to said strip, where the magnitude of said magnetic field pulse is different in said first orientation than in said second orientation.

10. The structure of claim 5, where each cycle of said magnetic field includes a magnetic field pulse having a first orientation and an opposite second orientation both of which are parallel to said strip, where the duration of said magnetic field pulse is different in said first orientation than in said second orientation.

11. An apparatus for moving magnetic bubble domains in a magnetic medium in response to a magnetic field in the plane of said medium of a magnitude at least as great as the stray magnetic fields of said bubble domains, said apparatus including means for repetitively stretching said bubble domains in a first direction and then in a second direction, said stretching in said first direction being greater than said stretching in said second direction to produce a net displacement of said bubble in said first direction, said means including a magnetic element adjacent to said magnetic medium having a geometry such that magnetic poles for bubble domain movement are not produced along said magnetic element as said magnetic domains move along said magnetic element.

12. The apparatus of claim 11, where said magnetic field has different amplitudes in said first and second directions.

13. The apparatus of claim 11, where said magnetic field has different durations in said first and second directions.

14. The apparatus of claim 13, where said magnetic element is a strip of magnetic material adjacent to said magnetic medium.

15. The apparatus of claim 13, where said magnetic element is an ion implanted region in said magnetic medium.

16. An apparatus for moving magnetic bubble domains in a magnetic medium in response to a magnetic field in the plane of said medium, said apparatus including means for repetitively stretching said bubble domains in a first direction, said means including means for applying a magnetic field in a first direction where said magnetic field has a magnitude at least as great as the stray field of said bubble domains and includes repetitive cycles of magnetic field pulses, the pulses in each cycle having an unequal rise and fall time, and a magnetic element adjacent to said magnetic medium, said element having a geometry such that any magnetic poles produced along said element in response to said magnetic field for movement of said bubble domains do not cause substantial bubble domain movement.

17. The apparatus of claim 16, where said magnetic element is a strip of magnetic material adjacent to said magnetic medium.

18. The apparatus of claim 16, where said magnetic strip is a region of ion implantation in said magnetic medium.

19. An apparatus for moving magnetic bubble domains in a magnetic medium, comprising:
a magnetic element having a geometry such that substantially no magnetic poles are produced therealong when a magnetic field directed along the length of said element is present in the plane of said magnetic element,
means for providing said magnetic field in the plane of said magnetic element which has a magnitude at least as great as the stray fields of said domains and which has a repetitive waveform with time, each said repetition of said waveform having at least two unequal parts.

20. The apparatus of claim 19, where each repetition of said waveform includes a magnetic field pulse whose rise time is not equal to its fall time.

21. The apparatus of claim 19, where each repetition of said magnetic field includes two oppositely directed magnetic field pulses, where the magnitudes of said pulses are not equal.

22. The apparatus of claim 19, where each repetition of said magnetic field includes two magnetic field pulses which have unequal time durations.

23. An apparatus for moving magnetic bubble domains in a magnetic medium, comprising:
an elongated magnetic strip along which said domains travel in response to a magnetic field directed along said strip,
means for producing said magnetic field having a magnitude at least as great as the stray fields of said domains, said field having a repetitive asymmetric waveform whih causes unequal stretching in opposite direction of a portion of the domain wall of said domains during each repetition of said waveform, said stretching being along the length of said magnetic strip when the magnitude of said field exceeds the magnitude of said stray fields.

* * * * *

UNITED STATES PATENT AND TRADEMARK OFFICE
CERTIFICATE OF CORRECTION

PATENT NO. : 4,007,445
DATED : Feb. 8, 1977
INVENTOR(S) : George E. Keefe and Yeong S. Lin It is certified that error appears in the above-identified patent and that said Letters Patent are hereby corrected as shown below:

In the drawing, sheet 1 of 2, FIG. 2C, should appear as follows:

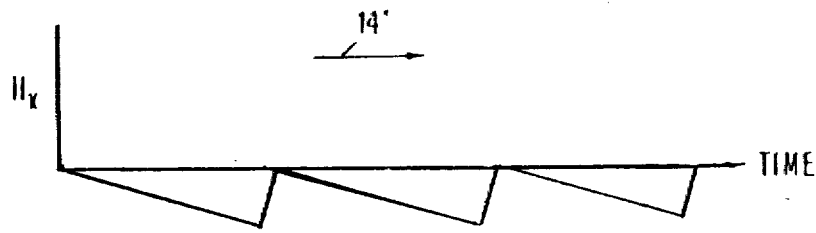

Signed and Sealed this

Twenty-eighth Day of March 1978

[SEAL]

Attest:

RUTH C. MASON
Attesting Officer

LUTRELLE F. PARKER
Acting Commissioner of Patents and Trademarks